United States Patent
Yuen et al.

(10) Patent No.: US 11,923,653 B2
(45) Date of Patent: Mar. 5, 2024

(54) ANGLED FLIP-CHIP BUMP LAYOUT

(71) Applicant: Lumentum Operations LLC, San Jose, CA (US)

(72) Inventors: Albert Yuen, Palo Alto, CA (US); Mitchell Srimongkol, Elk Grove, CA (US); Joseph Lin, San Jose, CA (US)

(73) Assignee: Lumentum Operations LLC, San Jose, CA (US)

(*) Notice: Subject to any disclaimer, the term of this patent is extended or adjusted under 35 U.S.C. 154(b) by 287 days.

(21) Appl. No.: 17/192,470

(22) Filed: Mar. 4, 2021

(65) Prior Publication Data

US 2022/0200232 A1   Jun. 23, 2022

Related U.S. Application Data

(60) Provisional application No. 63/130,235, filed on Dec. 23, 2020.

(51) Int. Cl.
*H01S 5/183* (2006.01)
*H01S 5/0234* (2021.01)
*H01S 5/42* (2006.01)

(52) U.S. Cl.
CPC ............ *H01S 5/0234* (2021.01); *H01S 5/423* (2013.01); *H01S 5/183* (2013.01)

(58) Field of Classification Search
CPC ....... H01S 5/0234; H01S 5/183–18397; H01S 5/423; H01S 5/04257; H01L 33/16; H01L 33/18
See application file for complete search history.

(56) References Cited

U.S. PATENT DOCUMENTS

| | | | |
|---|---|---|---|
| 2010/0303113 A1* | 12/2010 | Joseph | H01S 5/423 |
| | | | 372/36 |
| 2019/0173265 A1* | 6/2019 | Bisig | H01S 5/3202 |
| 2019/0181619 A1* | 6/2019 | Yuen | H01S 5/18308 |
| 2020/0335942 A1* | 10/2020 | Carson | H01S 5/0234 |
| 2021/0336422 A1* | 10/2021 | Tan | H01S 5/18327 |

\* cited by examiner

*Primary Examiner* — Minsun O Harvey
*Assistant Examiner* — Stephen Sutton Kotter
(74) *Attorney, Agent, or Firm* — Harrity & Harrity, LLP

(57) ABSTRACT

In some implementations, an optical device for mounting in a flip-chip configuration includes a plurality of flip-chip bumps that are arranged in a pattern on the optical device, wherein the pattern is not aligned with a crystal cleavage plane associated with a substrate of the optical device. In some implementations, the optical device further includes a gap that separates a primary region of the optical device and a secondary region of the optical device, wherein at least one portion of a side of the gap is oriented at a non-zero angle to the crystal cleavage plane.

22 Claims, 8 Drawing Sheets

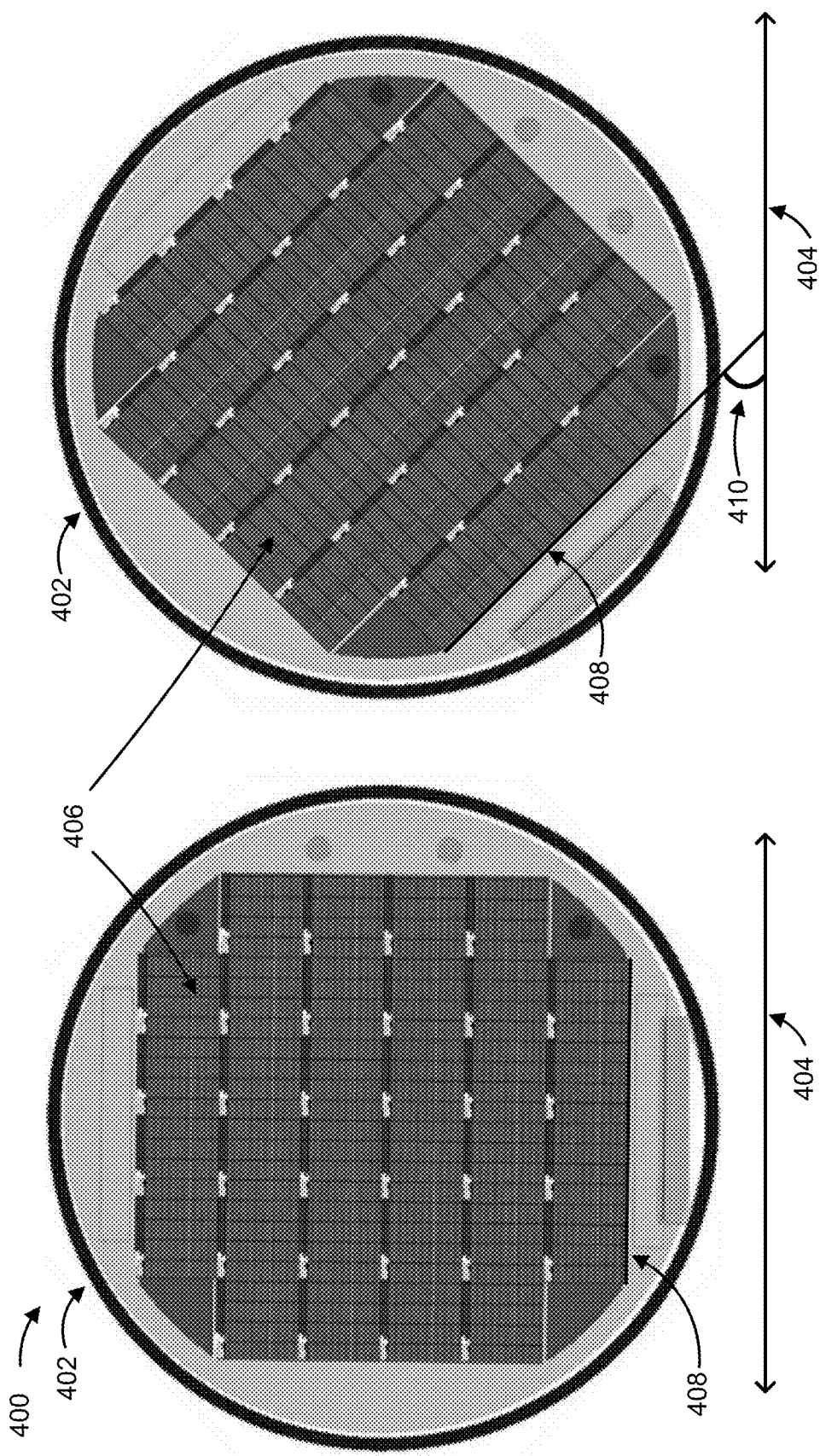

US 11,923,653 B2

ANGLED FLIP-CHIP BUMP LAYOUT

RELATED APPLICATION

This application claims priority to U.S. Provisional Patent Application No. 63/130,235, filed on Dec. 23, 2020, and entitled "ANGLED FLIP CHIP PAD LAYOUT TO REDUCE CRACKING ALONG A CRYSTAL CLEAVAGE PLANE," the content of which is incorporated by reference herein in its entirety.

TECHNICAL FIELD

The present disclosure relates generally to an angled flip-chip bump layout, and more particularly to an angled vertical cavity surface emitting laser (VCSEL) flip-chip layout.

BACKGROUND

A vertical-emitting device, such as a VCSEL, is a laser in which a beam is emitted in a direction perpendicular to a surface of a substrate (e.g., vertically from a surface of a semiconductor wafer). Multiple vertical-emitting devices may be arranged in an array with a common substrate that is associated with one or more crystallographic axes.

SUMMARY

In some implementations, an optical device for mounting in a flip-chip configuration includes a plurality of flip-chip bumps that are arranged in a pattern on the optical device, wherein the pattern is not aligned with a crystal cleavage plane associated with a substrate of the optical device.

In some implementations, an optical device for mounting in a flip-chip configuration includes a primary region, a secondary region, and a gap that separates the primary region and the secondary region, wherein at least one portion of a side of the gap is oriented at a nonzero angle to a crystal cleavage plane associated with a substrate of the optical device.

In some implementations, a wafer includes a plurality of chips that include a plurality of chip bumps; and a crystal cleavage plane associated with the wafer, wherein the plurality of chip bumps are arranged in a pattern on the plurality of chips, and wherein the pattern is not aligned with the crystal cleavage plane.

In some implementations, a wafer, includes a plurality of chips that include a plurality of gaps; and a crystal cleavage plane associated with the wafer, wherein the plurality of gaps are oriented at a non-zero angle to the crystal cleavage plane.

BRIEF DESCRIPTION OF THE DRAWINGS

FIGS. 4A-4B are diagrams of an example implementation described herein.

DETAILED DESCRIPTION

The following detailed description of example implementations refers to the accompanying drawings. The same reference numbers in different drawings may identify the same or similar elements.

In a conventional flip-chip device, such as a flip-chip VCSEL device, bondpads of a chip (e.g., a die of a wafer) attach to a submount or a printed circuit board (PCB). For example, the bondpads may attach to the submount or the PCB via a plurality of bumps (e.g., that comprise solder balls or other attachment materials). Typically, an edge of a bondpad is aligned with an edge of the chip (e.g., the edge of the bondpad is parallel to the edge of the chip) and/or bumps associated with the bondpad are aligned with the edge of the chip (e.g., aligned in one or more rows parallel to the edge of the chip). Accordingly, the edge of the bondpad and/or the bumps associated with the bondpad are often aligned with crystal cleavage planes of the chip (e.g., that are parallel with a crystallographic axis of the chip). Consequently, when mechanical strain on the chip is introduced by the bondpad and/or the bumps associated with the bondpad attaching (e.g., pulling) the chip to the submount, the chip can crack along one or more of the crystal cleavage planes. This adversely affects a performance and/or reliability of the chip. For example, one or more VCSELs of the chip that are located near the crack may not be able to generate light. Further, the crack may cause the chip to fail to satisfy durability and/or reliability requirements associated with a particular application.

Figure 1A:
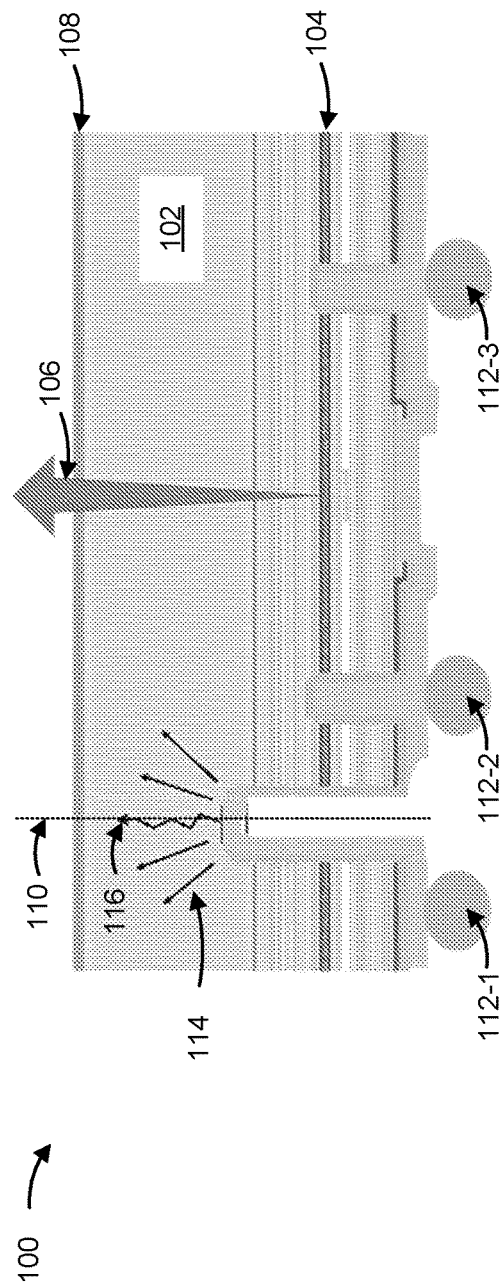
FIGS. 1A-1B illustrate a side view of a conventional flip-chip VCSEL device chip.
Figure 1B:
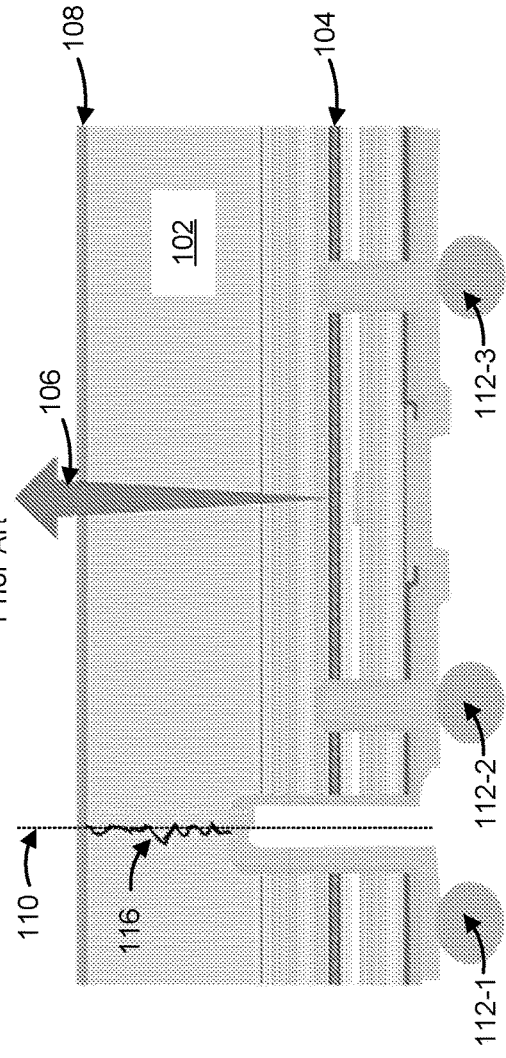

For example, FIGS. 1A-1B illustrate a side view of a conventional flip-chip VCSEL device chip 100 comprising a gallium arsenide (GaAs) substrate 102 (e.g., an n-GaAS substrate) and an active layer 104 that emits light 106 perpendicular to a top surface 108 of the chip 100. The substrate 102 may comprise one or more crystallographic axes and a crystal cleavage plane 110 (shown as running perpendicular to an image plane of FIGS. 1A-1B) may be parallel to one of the crystallographic axes. Bumps 112 (shown as bumps 112-1 through 112-3) may attach the chip 100 to a submount (not shown in FIGS. 1A-1B) and the crystal cleavage plane 110 may run between bumps 112-1 and 112-2. As shown in FIG. 1A, strain 114 may form along the crystal cleavage plane 110 due to mechanical stress created by the bumps 112-1 and 112-2 respectively pulling the chip 100 to the submount (e.g., due to thermal expansion stress associated with the chip 100 and the submount). As further shown in FIG. 1A, the strain 114 may cause a crack 116 (e.g., a dislocation, a fracture, a break, and/or the like) to develop in the substrate 102. FIG. 1B shows the crack 116 fully formed. Consequently, the crack 116 may impact a performance and/or reliability of the chip 100.

Some implementations described herein provide a chip of an optical device (e.g., for mounting in a flip-chip configuration). The chip may include a plurality of bumps that are arranged in a pattern on the chip that is oriented at a non-zero angle to a crystal cleavage plane associated with the chip. This may be referred to as a nonalignment of the bumps with respect to the crystal cleavage plane or a non-colinear alignment of the bumps to the crystal cleavage plane. In some implementations, the optical device further includes a gap that separates a primary region of the chip and a secondary region of the chip, wherein at least one portion of a side of the gap is oriented at a non-zero angle to the crystal cleavage plane.

In this way, the non-zero orientation of the pattern of bumps and/or the non-zero orientation of the gap to the crystal cleavage plane reduces an amount of mechanical stress generated along the crystal cleavage plane (e.g., that is created by attachment of the plurality of bumps, the first region of the chip, and/or the second region of the chip to a component, such as submount or PCB, of another device) than would otherwise be generated using a pattern of bumps with a zero degree orientation (e.g., oriented parallel to the crystal cleavage plane) and a gap with a zero degree orientation (e.g., as used by conventional flip-chip VCSEL device chip 100). Therefore, the chip, as described herein, is less likely to crack and therefore has an improved performance and/or reliability as compared to a conventional chip.

Figure 2A:
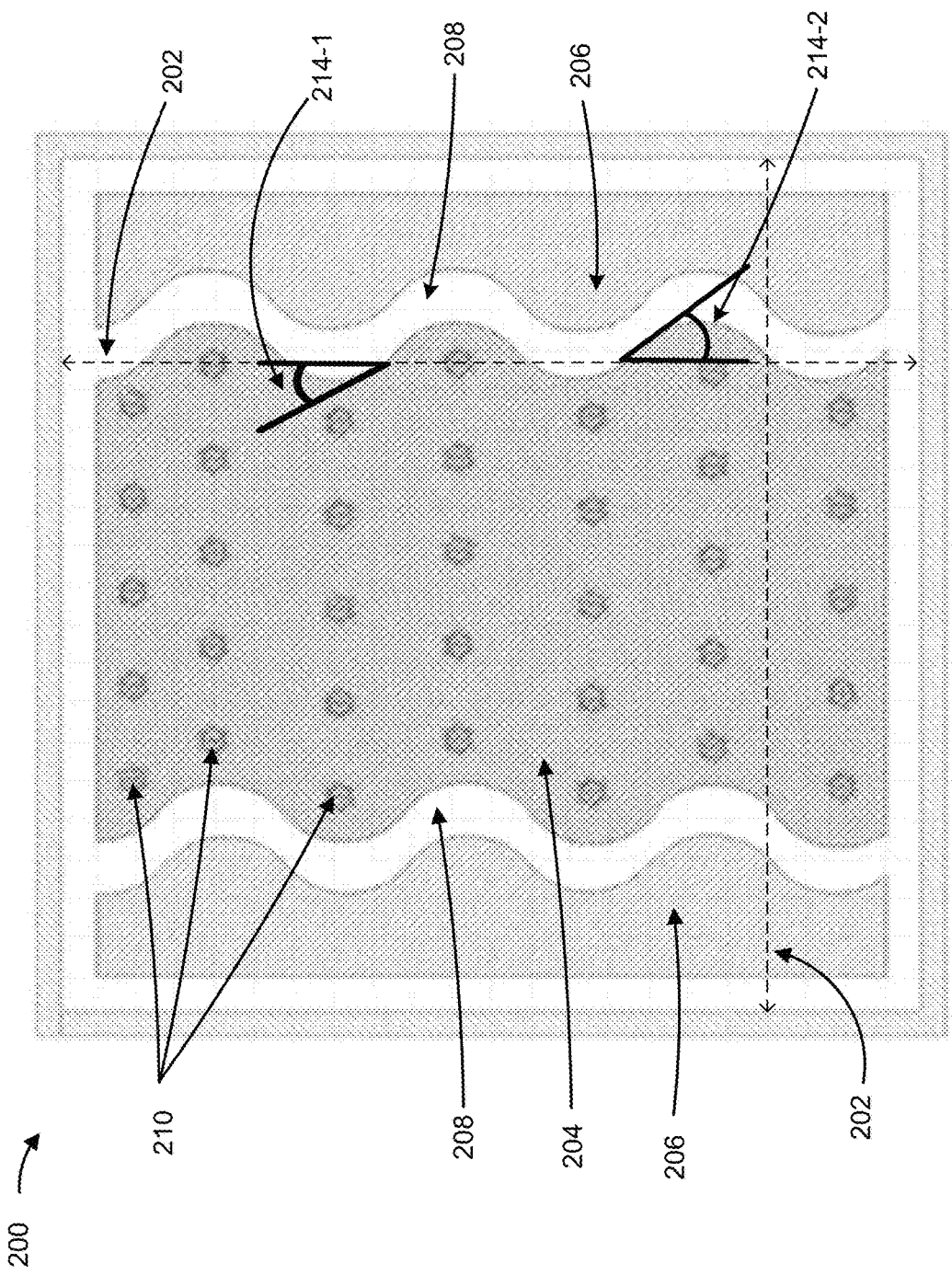
FIGS. 2A-2C are bottom view diagrams of an example chip of an optical device.
Figure 2B:
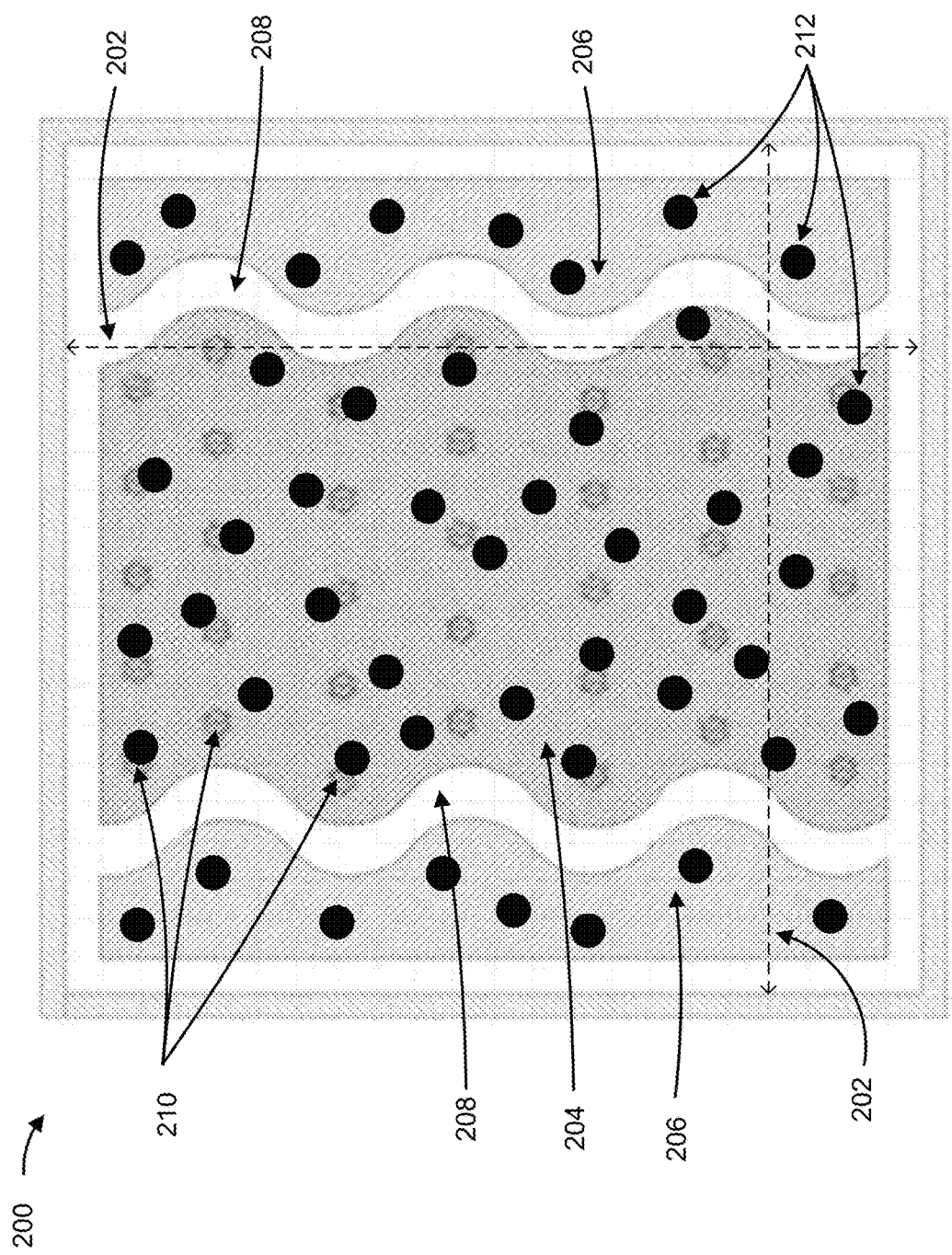
Figure 2C:
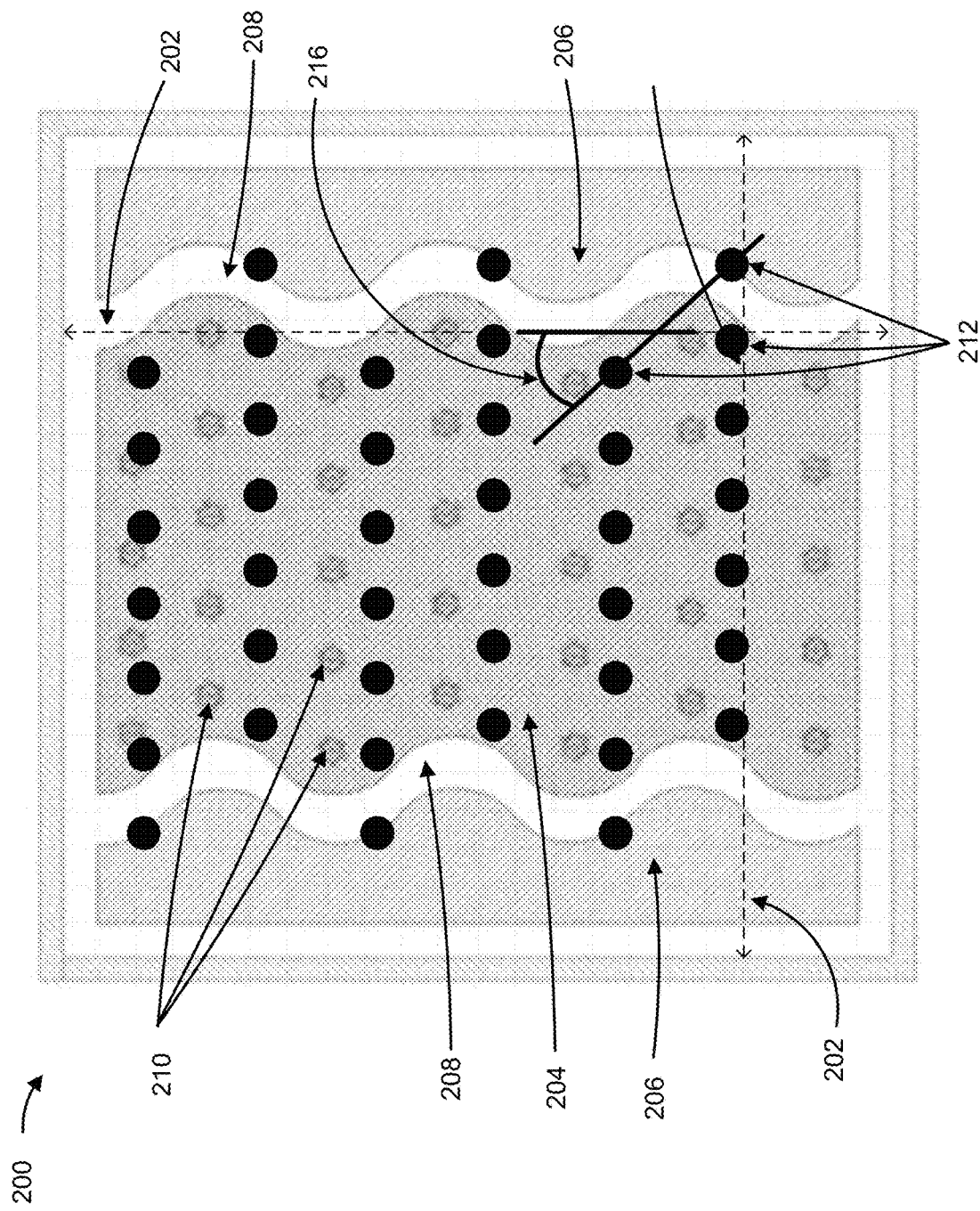

FIGS. 2A-2C are bottom view diagrams of an example chip 200 of an optical device (e.g., for mounting in a flip-chip configuration). As shown in FIGS. 2A-2C, the chip 200 may include one or more crystal cleavage planes 202, one or more primary regions 204, one or more secondary regions 206, one or more gaps 208, and one or more emitters 210 (e.g., one or more VCSELs). In some implementations, as shown in FIGS. 2B-2C, the chip 200 may include a plurality of bumps 212. These components are described in detail below.

In some implementations, the optical device may be a VCSEL optical device and the chip 200 may include a plurality of layers, such as a substrate and an active layer that emits light perpendicular to a first surface (e.g., a top surface, not shown in FIGS. 2A-2C) of the chip 200 via the one or more emitters 210. The chip 200 may include a second surface (e.g., a bottom surface that is shown in FIGS. 2A-2C) that is configured to mount the chip 200 to a component (e.g., a submount, a PCB, and/or the like) of another device (e.g., in a flip-chip configuration). As shown in FIGS. 2A-2C, the chip 200 may be associated with the one or more crystal cleavage planes 202. A crystal cleavage plane 202 may be parallel to a crystallographic axis associated with the chip 200 (e.g., parallel to a crystallographic axis of the substrate, the active layer, and/or one or more other layers of the chip 200). In some implementations, as shown in FIGS. 2A-2C, a crystal cleavage plane 202 may be parallel to a side (e.g., an edge) of the chip 200.

As further shown in FIGS. 2A-2C, the second surface of the chip 200 may comprise the one or more primary regions 204 (e.g., one or more primary bondpads) and the one or more secondary regions 206 (e.g., one or more secondary bondpads). The one or more primary regions 204 may be associated with an anode of the chip 200 (e.g., a primary region 204 may be a bondpad for an anode of the chip 200) and the one or more secondary regions 206 may be associated with a cathode of the chip 200 (e.g., a secondary region 206 may be a bondpad for a cathode of the chip 200) (or vice-versa). As further shown in FIGS. 2A-2C, the second surface may comprise one or more gaps 208 (e.g., a bondpad gap, an electrode gap, and/or the like). A gap 208 may separate (e.g., electrically isolate) a primary region 204 from a secondary region 206 on the second surface of the chip 200. In some implementations, a gap 208 may extend from a first side of the chip 200 to a second side of the chip 200 (e.g., to separate a primary region 204 from a secondary region 206). For example, as shown in FIGS. 2A-2C, a gap 208 may extend from within a threshold distance of a first side (e.g., a top side) of the chip 200 to within the threshold distance of a second side (e.g., a bottom side) of the chip 200. The threshold distance may be a percentage of a distance between the first side and the second side of the chip 200, such as 2% of the of the distance.

In some implementations, at least a portion of a side of a gap 208 may be oriented at a non-zero angle 214 to a crystal cleavage plane 202 of the chip 200. Accordingly, the gap 208 may be referred to as having a non-zero orientation to the crystal cleavage plane 202. For example, as shown in FIG. 2A, the one or more gaps 208 may respectively extend from a top side of the chip 200 to a bottom side of the chip 200 and have sinusoidal sides, where at least a portion of a sinusoidal side is oriented at a non-zero angle 214 to a crystal cleavage plane 202 that runs from the top side of the chip 200 to the bottom side of the chip 200. As shown in FIG. 2A, a first portion of a sinusoidal side of the right gap 208 may be oriented at a non-zero angle 214-1 to the crystal cleavage plane 202 and a second portion of the sinusoidal side may be oriented at a non-zero angle 214-2 (e.g., where the non-zero angle 214-1 and the non-zero angle 214-2 are different from each other). The non-zero angle 214 may be between approximately 5 degrees and 15 degrees (e.g., greater than or equal to 5 degrees and less than or equal to 15 degrees). In some implementations, a gap 208 may be configured to intersect a crystal cleavage plane 202. For example, as shown in FIG. 2A, one or more portions of a side of the right gap 208 may intersect the crystal cleavage plane 202 that runs from the top side of the chip 200 to the bottom side of the chip 200.

In some implementations, as shown in FIGS. 2B-2C, the chip 200 may comprise a plurality of bumps 212 (e.g., a plurality of flip-chip bumps that comprise, or are associated with solder pads, solder balls, epoxy, and/or the like for attaching the chip 200 to a component, such as a submount, a PCB, and/or the like, of another device) on the second surface of the chip 200. As shown in FIGS. 2B-2C, the plurality of bumps 212 may be arranged on the one or more primary regions 204 and/or the one or more secondary regions 206 of the second surface of the chip 200.

In some implementations, the plurality of bumps 212 may be arranged in a pattern (e.g., a one-dimensional or two-dimensional array pattern) on the second surface of the chip 200. For example, as shown in FIG. 2B, the plurality of bumps 212 may be arranged in a non-uniform pattern (e.g., a "random" or pseudo-random pattern), where individual bumps 212 are positioned at non-regular locations and/or bumps 212 are not equally spaced from one another. As another example, the plurality of bumps 212 may be arranged in a uniform pattern (as described below, at a non-zero angle 216 to a crystal cleavage plane 202), such as multiple rows of bumps 212 (e.g., where a row of bumps 212 includes two or more bumps 212) shown in FIG. 2C. The bumps 212 may be equally spaced (e.g., within a tolerance) within a row of bumps 212 (e.g., each bump 212, of the row of bumps 212, may be separated from an adjacent bump 212, of the row of bumps 212, by the same distance).

In some implementations, the uniform pattern may be oriented at a non-zero angle 216 to a crystal cleavage plane 202. For example, when the rows of bumps are arranged in multiple rows of bumps 212, as shown in FIG. 2C, adjacent rows of bumps 212, of the multiple rows of bumps 212, may be laterally offset from each other (in what may be referred to as an offset row pattern). Accordingly, a bump 212 from a first row of bumps 212, of the adjacent rows of bumps 212, and a corresponding bump 212 from a second row of bumps 212, of the adjacent rows of bumps 212, may be oriented at a non-zero angle 216 to a crystal cleavage plane 202. In some implementations, the non-zero angle 216 may be between approximately 5 degrees and 15 degrees (e.g., greater than or equal to 5 degrees and less than or equal to 15 degrees).

In this way, the non-zero orientation of the one or more gaps 208 and/or the non-zero orientation of the pattern of bumps 212 causes an amount of mechanical stress along a crystal cleavage plane 202 (e.g., that is created by attachment of the plurality of bumps 212 to a component, such as submount or PCB, of another device) to satisfy (e.g., be less than) a mechanical stress breakage threshold associated with the chip 200 (e.g., an amount of mechanical stress associated with creation of a crack in one or more layers of the chip 200, such as the substrate and/or active layer). Accordingly, the amount of mechanical stress along the crystal cleavage plane 202 is less than would otherwise be generated using a gap 208 with a zero orientation and/or a pattern of bumps 212 with a zero orientation, as is used in a conventional flip-chip device chip. Therefore, the chip 200 is less likely to crack and therefore has an improved performance and/or reliability as compared to a conventional flip-chip device chip.

As indicated above, FIGS. 2A-2C are provided as an example. Other examples may differ from what is described with regard to FIGS. 2A-2C.

Figure 3A:
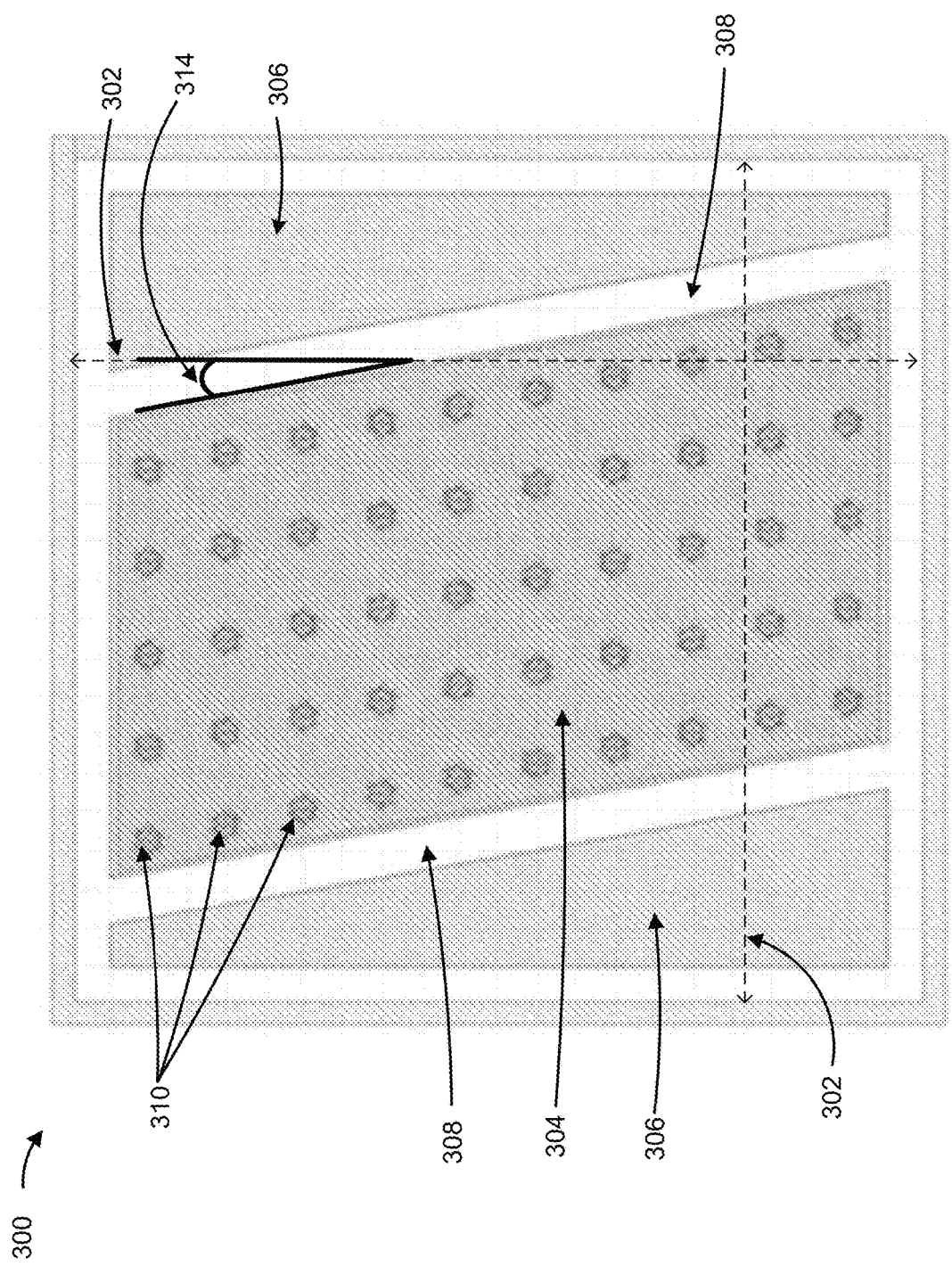
FIGS. 3A-3C are bottom view diagrams of an example chip of an optical device.
Figure 3B:
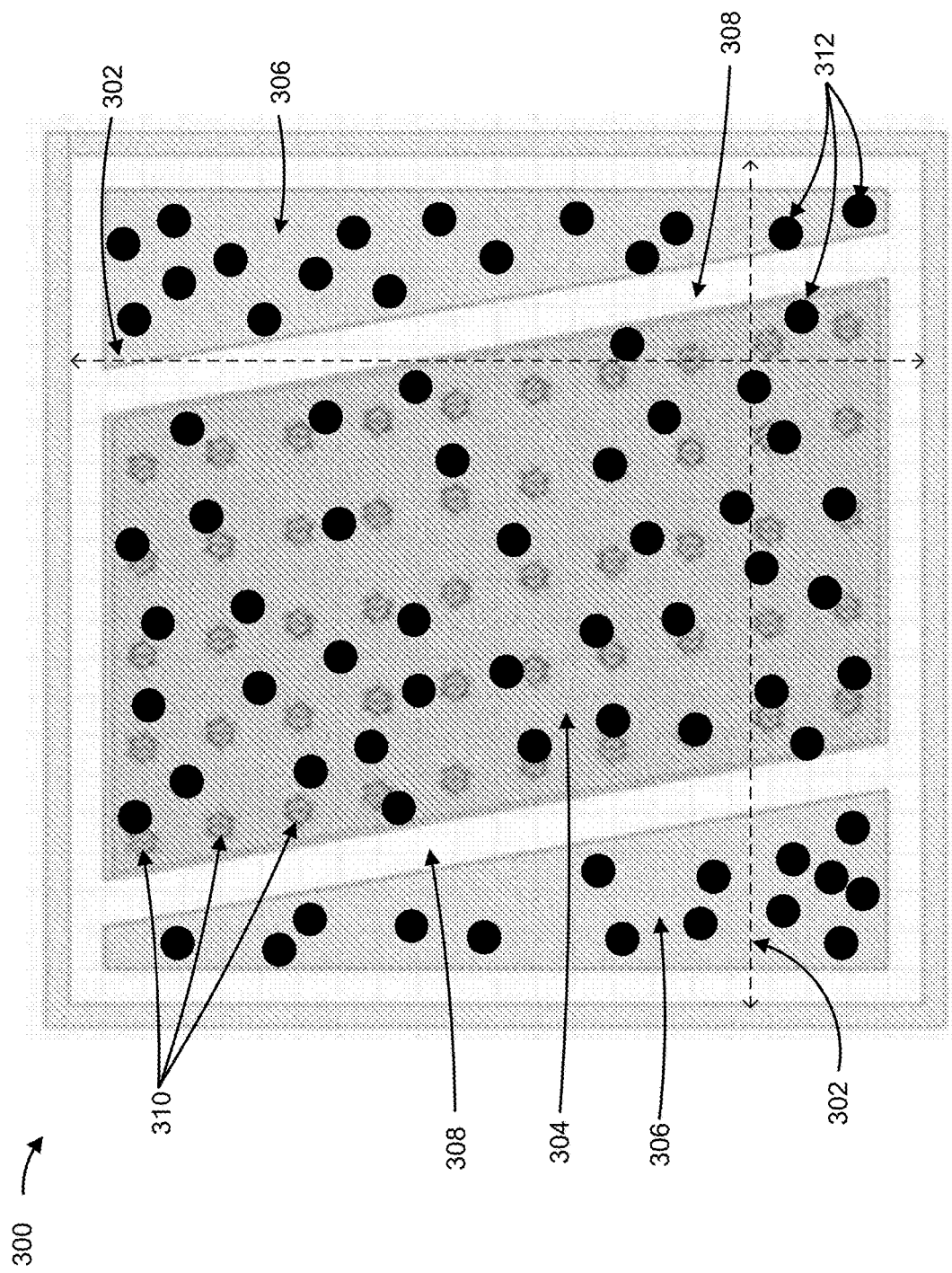
Figure 3C:
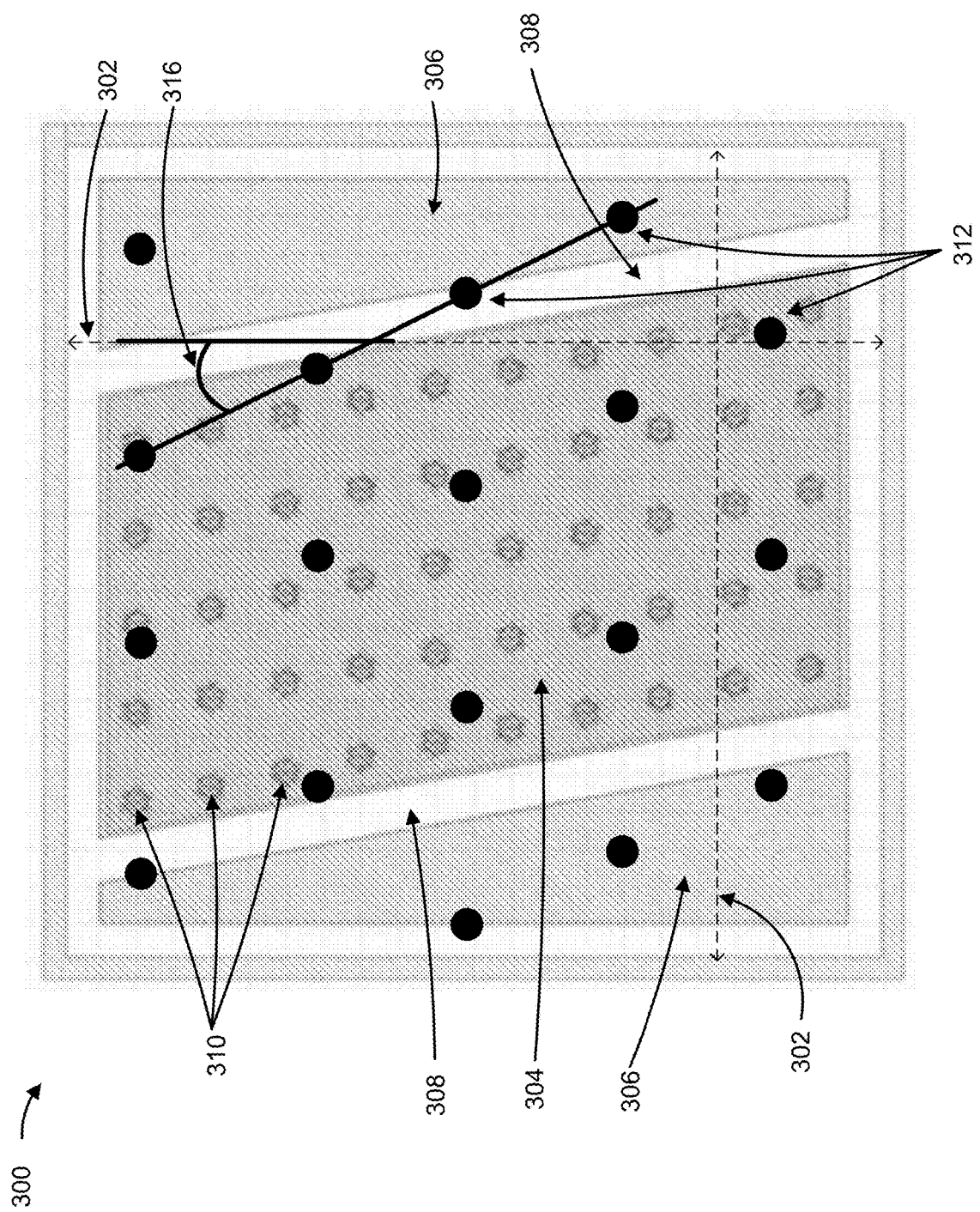

FIGS. 3A-3C are bottom view diagrams of an example chip 300 of an optical device (e.g., for mounting in a flip-chip configuration). As shown in FIGS. 3A-3C, the chip 300 may include one or more crystal cleavage planes 302, one or more primary regions 304, one or more secondary regions 306, one or more gaps 308, and one or more emitters 310 (e.g., one or more VCSELs). In some implementations, as shown in FIGS. 3B-3C, the chip 300 may include a plurality of bumps 312. These components are described in detail below.

In some implementations, the optical device may be a VCSEL optical device and the chip 300 may include a plurality of layers, such as a substrate and an active layer that emits light perpendicular to a first surface (e.g., a top surface, not shown in FIGS. 3A-3C) of the chip 300 via the one or more emitters 310. The chip 300 may include a second surface (e.g., a bottom surface that is shown in FIGS. 3A-3C) that is configured to mount the chip 300 to a component (e.g., a submount, a PCB, and/or the like) of another device (e.g., in a flip-chip configuration). As shown in FIGS. 3A-3C, the chip 300 may be associated with the one or more crystal cleavage planes 302. A crystal cleavage plane 302 may be parallel to a crystallographic axis associated with the chip 300 (e.g., parallel to a crystallographic axis of the substrate, the active layer, and/or one or more other layers of the chip 300). In some implementations, as shown in FIGS. 3A-3C, a crystal cleavage plane 302 may be parallel to a side (e.g., an edge) of the chip 300.

As further shown in FIG. 3, the second surface of the chip 300 may comprise the one or more primary regions 304 (e.g., one or more primary bondpads) and the one or more secondary regions 306 (e.g., one or more secondary bondpads). The one or more primary regions 304 may be associated with an anode of the chip 300 (e.g., a primary region 304 may be a bondpad for an anode of the chip 300) and the one or more secondary regions 306 may be associated with a cathode of the chip 300 (e.g., a secondary region 306 may be a bondpad for a cathode of the chip 300) (or vice-versa). As further shown in FIGS. 3A-3C, the second surface may comprise one or more gaps 308 (e.g., a bondpad gap, an electrode gap, and/or the like). A gap 308 may separate (e.g., electrically isolate) a primary region 304 from a secondary region 306 on the second surface of the chip 300. In some implementations, a gap 308 may extend from a first side of the chip 300 to a second side of the chip 300 (e.g., to separate a primary region 304 from a secondary region 306). For example, as shown in FIGS. 3A-3C, a gap 308 may extend from within a threshold distance of a first side (e.g., a top side) of the chip 300 to within the threshold distance of a second side (e.g., a bottom side) of the chip 300. The threshold distance may be a percentage of a distance between the first side and the second side of the chip 300, such as 3% of the of the distance.

In some implementations, at least a portion of a side of a gap 308 may be oriented at a non-zero angle 314 to a crystal cleavage plane 302 of the chip 300. Accordingly, the gap 308 may be referred to as having a non-zero orientation to the crystal cleavage plane 302. For example, as shown in FIG. 3A, the one or more gaps 308 may respectively extend from a top side of the chip 300 to a bottom side of the chip 300 and may have straight sides that have a non-zero angle 314 with respect to a crystal cleavage plane 302 that runs from the top side of the chip 300 to the bottom side of the chip 300. The non-zero angle 314 may be between approximately 5 degrees and 15 degrees (e.g., greater than or equal to 5 degrees and less than or equal to 15 degrees). In some implementations, a gap 308 may be configured to intersect a crystal cleavage plane 302. For example, as shown in FIG. 3A, one or more portions of a side of the right gap 308 may intersect the crystal cleavage plane 302 that runs from the top side of the chip 300 to the bottom side of the chip 300.

In some implementations, as shown in FIGS. 3B-3C, the chip 300 may comprise a plurality of bumps 312 (e.g., a plurality of flip-chip bumps that comprise, or are associated with solder pads, solder balls, epoxy, and/or the like for attaching the chip 300 to a component, such as a submount, a PCB, and/or the like, of another device) on the second surface of the chip 300. As shown in FIG. 3B-3C, the plurality of bumps 312 may be arranged on the one or more primary regions 304 and/or the one or more secondary regions 306 of the second surface of the chip 300.

In some implementations, the plurality of bumps 312 may be arranged in a pattern (e.g., a one-dimensional or two-dimensional array pattern) on the second surface of the chip 300. For example, as shown in FIG. 3B, the plurality of bumps 312 may be arranged in a non-uniform pattern, where individual bumps 312 are positioned at non-regular locations and/or bumps 312 are not equally spaced from one another. As another example, the plurality of bumps 312 may be arranged in a uniform pattern (as described below, at a non-zero angle 216 to a crystal cleavage plane 202), such as multiple rows of bumps 312 (e.g., where a row of bumps 312 includes two or more bumps 312) shown in FIG. 3C. The bumps 312 may be equally spaced within a row of bumps 312 (e.g., each bump 312, of the row of bumps 312, may be separated from an adjacent bump 312, of the row of bumps 312, by the same distance).

In some implementations, the uniform pattern may be oriented at a non-zero angle 316 to a crystal cleavage plane 302. For example, when the rows of bumps are arranged in multiple rows of bumps 312, as shown in FIG. 3C, adjacent rows of bumps 312, of the multiple rows of bumps 312, may be laterally offset from each other (e.g., in an offset row pattern). Accordingly, a bump 312 from a first row of bumps 312, of the adjacent rows of bumps 312, and a corresponding bump 312 from a second row of bumps 312, of the adjacent rows of bumps 312, may be oriented at a non-zero angle 316 to a crystal cleavage plane 302. In some implementations, the non-zero angle 316 may be between approximately 5 degrees and 15 degrees (e.g., greater than or equal to 5 degrees and less than or equal to 15 degrees).

In this way, the non-zero orientation of the one or more gaps 308 and/or the pattern of bumps 312 causes an amount of mechanical stress along a crystal cleavage plane 302 (e.g., that is created by attachment of the plurality of bumps 312 to a component, such as submount or PCB, of another device) to satisfy (e.g., be less than) a mechanical stress breakage threshold associated with the chip 300 (e.g., an amount of mechanical stress associated with creation of a crack in one or more layers of the chip 300, such as the substrate and/or active layer). Accordingly, the amount of mechanical stress along the crystal cleavage plane 302 is less than would otherwise be generated using a gap 308 with a zero orientation and/or a pattern of bumps 312 with a zero orientation, as is used in a conventional flip-chip device chip. Therefore, the chip 300 is less likely to crack and therefore has an improved performance and/or reliability as compared to a conventional flip-chip device chip.

As indicated above, FIGS. 3A-3C are provided as an example. Other examples may differ from what is described with regard to FIGS. 3A-3C.

FIGS. 4A-4B are diagrams of an example implementation 400 described herein. As shown in FIGS. 4A-4B, implementation 400 may include a processed wafer 402 (e.g., a processed semiconductor wafer). For example, the processed wafer 402 may be a wafer that is used to produce a plurality of chips (also referred to as dies), such as a plurality of chips 200 or a plurality of chips 300, for optical devices, such as VCSEL optical devices. In some implementations, the processed wafer 402 may include a substrate (e.g., that is a common substrate for the plurality of chips) that comprises one or more crystal cleavage planes 404, where a crystal cleavage plane 404 may be parallel to a crystallographic axis associated with the substrate. In some implementations, one or more masks 406 (e.g., one or more photolithography masks or photomasks used in a lithography process) may be used to create and/or define (e.g., used to manufacture) the plurality of chips and respective components of the plurality of chips. For example, the one or more masks 406 may be used to create and/or define a plurality of VCSELs of a chip and/or a plurality of bumps (e.g., one or more flip-chip bumps) of the chip (not visible in FIGS. 4A-4B due to a scale of the diagrams).

As shown in FIG. 4A, the one or more masks 406 may be aligned with a crystal cleavage plane 404 (e.g., as indicated by an edge 408 of the one or more masks 406 being parallel to the crystal cleavage plane 404). Accordingly, the one or more masks 406 may create and/or define a plurality of gaps without a non-zero orientation to a crystal cleavage plane 404 and/or a plurality of bumps that are arranged in a pattern without a non-zero orientation to a crystal cleavage plane 404. For example, the one or more masks 406 may create and/or define gaps with sides that run parallel to the crystal cleavage plane 404 and/or a pattern of a plurality of non-offset rows of bumps, where sets of the plurality of bumps (e.g., individual rows of bumps) may run parallel to the crystal cleavage plane 404. In some implementations, as shown in FIG. 4B, the one or more masks 406 may be rotated (e.g., as indicated by the non-zero orientation angle 410) relative to the wafer 402 (e.g., as indicated by the edge 408 of the one or more masks 406 being oriented at the orientation angle 410 to the crystal cleavage plane 404). Accordingly, the one or more masks 406 may create and/or define gaps with non-zero orientation and/or a plurality of bumps that are arranged in a pattern with a non-zero orientation. For example, the one or more masks 406 may create and/or define gaps with sides that have the non-zero orientation angle 410 to the crystal cleavage plane 404 and/or a pattern of a plurality of non-offset rows of bumps, where sets of the plurality of bumps (e.g., individual rows of bumps) may have the non-zero orientation angle 410 to the crystal cleavage plane 404 (e.g., because of the rotation of the one or more masks 406 relative to the wafer 402).

As indicated above, FIGS. 4A-4B are provided as an example. Other examples may differ from what is described with regard to FIGS. 4A-4B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "top," "bottom," "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:
1. An optical device for mounting in a flip-chip configuration, comprising:
a primary region;
a secondary region; and a gap that separates the primary region and the secondary region, wherein:
  a first portion of a side of the gap is oriented at a first non-zero angle to a crystal cleavage plane associated with a substrate of the optical device,
  a second portion of the side of the gap is oriented at a second non-zero angle to the crystal cleavage plane,
  the first non-zero angle is different from the second non-zero angle, and
  more than two portions of the side of the gap intersect the crystal cleavage plane.

2. The optical device of claim 1, wherein the first non-zero angle is within a range of 5 to 15 degrees.

3. The optical device of claim 1, further comprising a plurality of flip-chip bumps that are arranged in a pattern on at least one of the primary region and the secondary region.

4. The optical device of claim 1, wherein the optical device is a vertical-cavity surface-emitting laser (VCSEL) optical device.

5. The optical device of claim 1, wherein the primary region is associated with an anode associated with the optical device and the secondary region is associated with a cathode associated with the optical device.

6. The optical device of claim 1, wherein the orientation of the first portion of the side of the gap causes an amount of mechanical stress along the crystal cleavage plane to satisfy a mechanical stress breakage threshold,
  wherein the amount of mechanical stress is created by attachment of the primary region and the secondary region to a component of another device.

7. The optical device of claim 1, wherein the gap extends from within a threshold distance of a first side of the optical device to within the threshold distance of a second side of the optical device.

8. The optical device of claim 3, wherein the pattern is not aligned with the crystal cleavage plane.

9. The optical device of claim 3, wherein the pattern comprises multiple rows of flip-chip bumps,
  wherein adjacent rows, of the multiple rows, are laterally offset from each other.

10. The optical device of claim 3, wherein the pattern is a non-uniform pattern.

11. The optical device of claim 1, wherein the second non-zero angle is within a range of 5 to 15 degrees.

12. The optical device of claim 1, wherein the side of the gap has a sinusoidal shape.

13. A wafer, comprising:
  a plurality of chips that include a plurality of gaps; and
  a crystal cleavage plane associated with the wafer, wherein:
    a first portion of a side of a gap of the plurality of gaps is oriented at a first non-zero angle to the crystal cleavage plane,
    a second portion of the side of the gap is oriented at a second non-zero angle to the crystal cleavage plane,
    the first non-zero angle is different from the second non-zero angle, and
    more than two portions of the side of the gap intersect the crystal cleavage plane.

14. The wafer of claim 13, wherein the plurality of chips include a plurality of chip bumps, wherein:
  the plurality of chip bumps are arranged in a pattern on the plurality of chips.

15. The wafer of claim 14, wherein the pattern of chip bumps is a result of a rotation, relative to the wafer, of a mask used to manufacture the plurality of chip bumps.

16. The wafer of claim 14, wherein the pattern comprises a non-uniform pattern of chip bumps.

17. The wafer of claim 14, wherein the pattern comprises multiple rows of chip bumps,
  wherein adjacent rows, of the multiple rows, are laterally offset from each other.

18. The wafer of claim 14, wherein the pattern comprises a uniform pattern of chip bumps.

19. The wafer of claim 13, wherein the side of the gap has a sinusoidal shape.

20. The wafer of claim 13, wherein at least one of the first non-zero angle or the second non-zero angle is within a range of 5 to 15 degrees.

21. The wafer of claim 13, wherein the plurality of chips are vertical-cavity surface-emitting laser (VCSEL) chips.

22. The wafer of claim 13, wherein the orientation of the first portion of the side of the gap causes an amount of mechanical stress along the crystal cleavage plane to satisfy a mechanical stress breakage threshold.

* * * * *